United States Patent [19]

Bronstert et al.

[11] Patent Number: 4,816,379
[45] Date of Patent: Mar. 28, 1989

[54] PRODUCTION OF RELIEF PLATES AND PRINTING PLATES BY A POSITIVE-WORKING METHOD

[75] Inventors: Bernd Bronstert; Gerhard Hoffmann, both of Otterstadt; John Lynch, Monsheim, all of Fed. Rep. of Germany

[73] Assignee: BASF Aktiengesellschaft, Ludwigshafen, Fed. Rep. of Germany

[21] Appl. No.: 725,151

[22] Filed: Apr. 22, 1985

Related U.S. Application Data

[63] Continuation of Ser. No. 563,809, Dec. 21, 1983, abandoned.

[30] Foreign Application Priority Data

Dec. 28, 1982 [DE] Fed. Rep. of Germany ....... 3248246

[51] Int. Cl.$^4$ ................................................ G03C 7/02
[52] U.S. Cl. ..................................... 430/306; 430/281; 430/326; 430/915; 430/920; 430/922
[58] Field of Search ............... 430/326, 281, 915, 920, 430/922, 306

[56] References Cited

U.S. PATENT DOCUMENTS

| | | | |
|---|---|---|---|
| 3,556,794 | 1/1971 | Margerum | 96/45.1 |
| 3,573,922 | 4/1971 | Rust | 430/915 |
| 3,615,452 | 10/1971 | Cerwonka | 430/281 |
| 3,627,656 | 12/1971 | Miller et al. | 430/281 |

FOREIGN PATENT DOCUMENTS 1366769 9/1974 United Kingdom .

OTHER PUBLICATIONS

Oster et al., J. Amer. Chem. Soc., vol. 79 (1957) pp. 595–598.
Res. Discl., No. 156, Apr. 1977, pp. 65–68, No. 15613, Havant, Hampshire, GB: J. A. Van Allan et al., "Sensitizers for Photocrosslinkable Polymers".
Res. Discl., No. 158, Jun. 1977, p. 70, No. 15868, Havant, Hampshire, GB: R. E. Gilson, "A Reversible Negative Working Litoplate".

Primary Examiner—Jack P. Brammer
Attorney, Agent, or Firm—Keil & Weinkauf

[57] ABSTRACT

Relief plates and printing plates are produced by a positive-working process, using a photopolymerizable layer which contains one or more photopolymerizable, olefinically unsaturated compounds, one or more photoinitiators which can be activated by UV light, and a combination of a phenothiazinium, phenoxazinium, phenazinium or acridinium dye with a mild reducing agent which, on exposure to visible light, is capable of reducing the dye in the excited electronic state. The photopolymerizable layer is exposed imagewise to light having a wavelength longer than 450 nm, and simultaneously or subsequently exposed uniformly to light having a wavelength of from 300 to 420 nm, after which the unpolymerized areas of the layer are removed.

22 Claims, No Drawings

PRODUCTION OF RELIEF PLATES AND PRINTING PLATES BY A POSITIVE-WORKING METHOD

This application is a continuation of application Ser. No. 563,809, filed on Dec. 21, 1983, now abandoned.

The present invention relates to a positive-working process for the production of relief plates and printing plates, wherein, in a photosensitive photopolymerizable layer, areas in which the polymerizability is suppressed are produced by imagewise exposure, the still polymerizable areas of the layer are polymerized by means of a further exposure, and the relief plate or printing plate is then developed by removing the unpolymerized areas of the layer.

The conventional photosensitive photopolymerizable recording materials for the production of relief plates and printing are generally negative-working, ie. when the photopolymerizable layer is exposed imagewise, the exposed areas of this layer undergo photopolymerization and become insoluble in solvents in which they were previously soluble, while the unexposed areas of the layer, which are covered by the image-bearing transparency, remain soluble and are removed when the relief plate or printing plate is developed.

These photopolymerizable recording materials generally require relatively long exposure times and therefore cannot be exposed in reasonable times using a process camera. Moreover, they are incompatible with the conventional laser exposure units, and these modern exposure methods therefore cannot be used for such recording materials. In addition, it is frequently desirable to produce a relief plate or printing plate which constitutes a positive copy of the original. To produce positive images with negative-working recording materials, an additional photographic step is always necessary, which means a substantial restriction because photographic negatives are not always advantageous.

Processes have also been disclosed which permit the production of positive images of the image-bearing transparencies by means of photosensitive photopolymerizable layers. The term "positive-working recording materials" is to be understood as meaning materials in which the areas of the photosensitive layer which correspond to the dark or opaque areas of the original are photopolymerized, whereas those areas of the said layer which correspond to the pale or transparent areas of the original remain essentially unpolymerized and are removed during development of the image relief, leaving behind the photopolymerized areas.

In the process described in U.S. Pat. No. 3,380,825, for example, the photopolymerizable layer is subjected to a first imagewise exposure under conditions such that the photoinitiator, which has been excited by actinic light in the exposed areas, is rendered ineffective by a gaseous polymerization inhibitor, no significant polymerization taking place. The photosensitive layer is then shielded from the gaseous inhibitor during a second non-imagewise exposure to the same actinic light, photopolymerization taking place only in those areas in which the photoinitiator was not consumed in the first imagewise exposure. However, this process not only requires a very careful procedure to ensure that the desired photopolymerization takes place during the second exposure, but, because of the treatment measures required, is also difficult to carry out in practice.

German Printed Application DAS No. 2,338,223 describes a process for the production of positive images, in which a photopolymerizable layer which contains a hydrogen donor, a hexaarylbisimidazole, an ethylenically unsaturated compound which can undergo free-radical polymerization and a polymeric binder in certain proportions is first exposed imagewise to high-intensity radiation, as a result of which the photopolymerizability in the exposed areas of the layer is destroyed, and the entire layer is then exposed to low-intensity radiation, with the result that photopolymerization is initiated in the previously unexposed areas. The disadvantage of this process is that both the first, imagewise exposure and the second, uniform exposure of the photopolymerizable layer are carried out using actinic light of the same wavelength; very exact and careful monitoring of the light intensity is therefore necessary in order to achieve the required, desirable differentiation between the exposed and unexposed areas of the layer by means of the photopolymerization. In this process too, the required total exposure times are too long for use in practice, as is evident from the examples of German Printed Application DAS No. 2,338,223.

German Laid-Open Application DOS No. 2,710,417 and U.S. Pat. No. 3,556,794 describe processes for the production of positive images, in which a photopolymerizable layer which contains one or more photopolymerizable compounds, an initiator system which can be activated by light and a nitroaromatic compound is first exposed imagewise to short wave light having a wavelength of from 200 to about 400 nm, the nitroaromatic compound being converted into a polymerization inhibitor; the layer is then exposed to light having a longer wavelength (more than 400 nm), with the result that photopolymerization is initiated in the areas of the layer which were not exposed during the first, imagewise exposure. While the photoactivatable initiator systems mentioned in German Laid-Open Application DOS No. 2,710,417 are, for example, compounds such as derivatives of benzophenone, phenanthroquinone or imidazole dimers, the photoinitiator system employed according to U.S. Pat. No. 3,556,794 is a combination of a dye and of a reducing agent or a catalyst which is capable of producing free radicals.

U.S. Pat. No. 3,556,794 describes, in particular, the production of visible positive images; the production of relief plates and, in particular, printing plates is not mentioned therein. According to the processes described in German Laid-Open Application DOS No. 2,710,417 and U.S. Pat. No. 3,556,794, the polymerization is initiated by exposing the photopolymerizable mixtures to light in the visible wavelength range. However, photopolymerization with such light is generally not very advantageous for the production of relief plates and printing plates, since the luminous efficiency in such cases is unsatisfactory; consequently, the extent of polymerization is frequently insufficient for the production of relief plates and printing plates. It is therefore expedient and also usual in practice, to polymerize photosensitive photopolymerizable recording materials for the production of such plates by exposure to UV light.

It is an object of the present invention to provide a positive-working process for the production of relief plates and printing plates starting from photosensitive photopolymeriazble layers, in which the photopolymerization in the layer can be initiated by exposure to UV light, conventional lasers can be used for the exposure, and very short exposure times can be employed, and which is easy to carry out and gives relief plates and printing plates that faithfully reproduce the original and have a properly structured relief image.

We have found, suprisingly, that this object is achieved, and that relief plates and printing plates which constitute a positive image of an image-bearing transparency and possess the desired properties can be produced rapidly and simply by a process in which a photopolymerizable layer, which contains one or more photopolymerizable compounds, one or more photopolymerization initiators which can be activated with UV light and a combination of a specific dye and a reducing agent for this dye in the excited electronic state, is exposed imagewise to light of longer wavelength, in particular light in the visible wavelength range, to produce a compound which inhibits photopolymerization in the layer, the layer is simultaneously or subsequently exposed uniformly to UV light, with the result that those areas of the layer which have not been exposed to the light of longer wavelength undergo polymerization, and the unpolymerized areas of the layer are then removed to develop the relief plate or printing plate.

The present invention accordingly relates to a positive-working process for the production of relief plates and printing plates, wherein a photopolymerizable layer, containing (a) one or more compounds possessing one or more photopolymerizable olefinically unsaturated double bonds, (b) one or more photoinitiators which, when exposed to light having a wavelength of from 300 to 420 nm, initiate rapid photopolymerization in the layer, and (c) additives, is exposed imagewise, with the result that the polymerizability is suppressed in the exposed areas; the initially unexposed, still photopolymerizable areas of the layer are polymerized by a further exposure to light in the wavelength range of from 300 to 420 nm; and the relief plate or printing plate is then developed by removing, in particular by washing out, the unpolymerized areas of the layer. In this process, the layer contains a combination of (c1) from 0.0001 to 1% by weight, based on the sum of all the components of the layer, of a soluble dye of the formula (I)

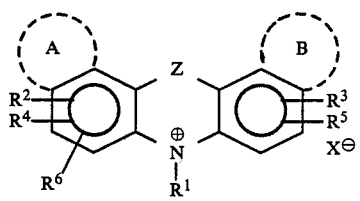

(I)

where

Z is N, O, S or $CR^7$, $R^1$ is hydrogen, $C_1$–$C_4$-alkyl, unsubstituted or substituted phenyl or naphthyl, $R^2$ and $R^3$ are identical or different radicals and are each hydrogen, hydroxyl, $C_1$–$C_4$-alkoxy, phenoxy, unsubstituted or substituted diarylmethyl and $NR_2$ [where R is H or an unsubstituted or substituted alkyl, aryl or aralkyl radical, and the two radicals R can be identical or different], $R^4$ and $R^5$ are identical or different radicals and are each hydrogen, $C_1$–$C_4$-alkyl, phenyl, hydroxyl, $C_1$–$C_4$-alkoxy, sulfo and $NR_2$ [where R is H or an unsubstituted or substituted acyl, alkyl, aryl or aralkyl radical, and the two radicals R can be identical or different], $R^6$ is hydrogen, hydroxyl, $C_1$–$C_4$-alkoxy, carboxyl, carbalkoxy, N-acylamino or halogen, $R^7$ is hydrogen, $C_1$–$C_4$-alkyl or an unsubstituted or substituted aryl or aralkyl group, $X^\ominus$ is an acid anion, and A and B can be identical or different and are each hydrogen or a benzocyclic, naphthocyclic or heterocyclic system fused in the a-, b- or c-position, with the proviso that if A is a fused ring system of the stated type, one of the radicals $R^2$ and $R^4$ is absent, and (c2) a sufficient amount of a mild reducing agent which does not reduce the dye (c1) in the absence of actinic light, but is capable of reducing this dye after it has been converted to the excited electronic state by exposure to light having a wavelength longer than 450 nm, in particular to light in the visible wavelength range, and the layer is exposed imagewise to light having a wavelength longer than 450 nm, in particular to light in the visible wavelength range, with the result that, in the layer, the dye (c1) is reduced imagewise to produce a compound which inhibits photopolymerization in the layer when the photoinitiator (b) is activated, or inactivates this photoinitiator; simultaneously or subsequently, the layer is exposed uniformly to light having a wavelength of from 300 to 420 nm, with the result that those areas of the layer which were not exposed to the light of longer wavelength undergo polymerization, and the unpolymerized areas of the layer are then removed.

The present invention furthermore relates to specific embodiments of the novel process, as described in detail below.

It is very surprising that, when photopolymerizable layers which contain one or more photopolymerizable compounds, one or more photoinitiators which can be activated by light having a wavelength of from 300 to 420 nm, and, as additives, the said dyes and reducing agents, are exposed to light having a relatively long wavelength, in particular visible light, the polymerizability of the layer can be suppressed or inhibited so that no significant polymerization takes place when the layer is exposed to UV light (300–420 nm), with the result that those areas of the layer which have been exposed in this manner can be removed or washed out without difficulty during the subsequent development of the relief plates or printing plates. Even though the stabilizing action of a mixture of phenothiazine and p-nitrosophenol on monomeric acrylates is described in, for example, German Laid-Open Application DOS No. 2,931,553, and some of the dyes of the formula (I), eg. methylene blue, have been disclosed as thermopolymerization inhibitors for photopolymerization mixtures (cf. for example German Laid-Open Application DOS No. 2,215,090), it could not in any way be foreseen that the addition of the said combination of a dye of the formula (I) and the reducing agent would substantially or completely prevent the photopolymerization in the layers which can be photopolymerized with UV light, particularly in view of the fact that such mixtures of the said dyes and reducing agents are described, inter alia, in U.S. Pat. Nos. 3,556,794 and 3,097,097 and J. Amer. Chem. Soc. 79 (1957), 595–598, as initiator systems for the photopolymerization of, in particular, acrylyl monomers. It was also not to be expected that, using the novel process, it would be possible to maintain comparatively very short exposure times for the photopolymerization and furthermore achieve good differentiation between the polymerized and unpolymerized areas of the layer, as required for the production of relief plates and printing plates. The novel process gives relief plates and printing plates which faithfully reproduce the original and have good, in some cases improved, properties, in particular very well defined relief images.

Another particular advantage of the novel process is the fact that the absorption properties of the added dye change extremely rapidly during the imagewise exposure, without this change having any adverse effect on the processing of the photopolymerizable layer. Depending on the particular dye selected on the basis of the dye structures stated above, a very large variety of desirable effects, from complete bleaching of the dyes to a shift in hue from, for example, blue to red, can be achieved. In the novel process for the production of relief plates and printing plates, this property of the layers used according to the invention substantially facilitates the evaluation of the exposed plates. In practice, therefore, dyes which are preferably used as additives are those which make it particularly easy to evaluate the exposed plate visually.

We have found that only the dyes of the formula (I) are suitable for the novel process. Structurally similar dyes, eg. the di- or triphenylmethane dyes or the xanthene dyes, which are also frequently used in photopolymerizable layers, do not give the effects achieved with the dyes used according to the invention, of the formula (I), and therefore cannot be employed as component (c1) in the novel process.

The layers used in the novel process contain, as an essential component (a), one or more compounds possessing one or more photopolymerizable, olefinically unsaturated double bonds. The conventional monomers, oligomers and/or unsaturated polymers used for the production of relief plates and photopolymer letterpress, gravure and offset printing plates can be used; the type of compound used depends on the intended use of the photopolymerizable layer, on the nature of the other components of the mixture and, in the preferred case where polymeric binders are also present in the mixture for the layer, on the type of binders and the compatability of the compound with these binders. Monomers and/or oligomers having 2 or more olefinically unsaturated photopolymerizable double bonds are preferably used, either individually or as a mixture with monomers having only one olefinically unsaturated photopolymerizable double bond. Polymers having several terminal olefinically unsaturated double bonds and/or olefinically unsaturated double bonds in side chains can also be used, either as individual photopolymerizable compounds or as a mixture with the monomers and/or oligomers. Examples of suitable monomers are the di- and polyacrylates and -methacrylates, as can be obtained by esterifying a diol or polyol with acrylic acid or methacrylic acid. These include the di- and triacrylates and -methacrylates of ethylene glycol, diethylene glycol, triethylene glycol, polyethylene glycols having a molecular weight of up to about 500, propane-1,2-diol, propane-1,3-diol, neopentylglycol (2,2-dimethylpropanediol), butane-1,4-diol, 1,1,1-trimethylolpropane, glycerol and pentaerythritol; the monoacrylates and monomethacrylates of such diols and polyols, eg. ethylene glycol monoacrylate, diethylene glycol monoacrylate, triethylene glycol monoacrylate and tetraethylene glycol monoacrylate and the corresponding monomethacrylates; and monomers which have two or more olefinically unsaturated bonds and contain urethane and/or amide groups, such as the low molecular weight compounds prepared from aliphatic diols of the above type, organic diisocyanates and hydroxyalkyl acrylates or methacrylates. Other examples include acrylic acid, methacrylic acid and their derivatives, eg. acrylamide, methacrylamide, N-hydroxymethyl acrylamide, N-hydroxymethylmethacrylamide and the acrylates and methacrylates of monoalcohols of 1 to 6 carbon atoms.

Preferably, the layers used in the novel process also contain one or more polymeric binders. Suitable binders are the organic polymeric binders conventionally used for photopolymerizable mixtures for the production of relief plates and printing plates; these binders should be compatible with the photopolymerizable olefinically unsaturated compounds (a) present and, as is obvious to one skilled in the art, should be soluble or dispersible in the developer so that the non-crosslinked areas of the layer can be washed out after exposure. Suitable polymeric, olefinically saturated or unsaturated binders are unsaturated polyesters, linear nylons and, in particular, alcohol-soluble nylon copolymers, as described in French Pat. No. 1,520,856, cellulose derivatives, in particular those which can be washed out with an aqueous alkaline developer, vinyl alcohol polymers and polymers and copolymers of vinyl esters of aliphatic monocarboxylic acids of 1 to 4 carbon atoms, eg. of vinyl acetate, having various degrees of hydrolysis, polyurethanes, such as polyetherurethanes and polyester-urethanes, polyacrylates and polymethacrylates, styrene/butadiene, styrene/isoprene, styrene/butadiene/isoprene and styrene/maleic anhydride copolymers, copolymers of styrene with maleic acid esters of half-esters, styrene/maleic anhydride/(meth)acrylic acid copolymers, and modified polyvinyl alcohol derivatives, eg. polyvinylbutyral or the reaction product, mentioned in German Laid-Open Application DOS No. 3,015,340, of a polyvinyl alcohol with a certain amount of acrylic or methacrylic anhydride. Furthermore, suitable polymeric binders for production of relief printing plates for flexographic printing or elastomeric diene polymers and copolymers, for example those of butadiene and/or isoprene; of these, the block copolymers which contain polybutadiene and/or polyisoprene blocks and polymer blocks of styrene and/or α-methylstyrene are particularly preferred. The nitrile rubbers eg. the butadiene/acrylonitrile copolymers, are also useful.

If the photopolymerizable layer contains polymeric binders, their amount is in general about 5–90, in particular 45–80, % by weight, based on the sum of polymeric binders and photopolymerizable compounds. The content of polymeric binder depends in particular on the use of the photopolymerizable layer. Which photopolymerizable olefinically unsaturated monomers, oligomers and/or polymers can advantageously be combined with which polymeric binders can be found in the relevant patent literature.

The photopolymerizable layers used in the novel process contain, as is customary in the art, one or more photoinitiators (b) which, when the layer is exposed to light having a wavelength of from 300 to 420 nm, initiate rapid photopolymerization in the layer. The photoinitiator (b) is present in the layer in general in an amount of from 0.01 to 10, preferably from 0.01 to 3, % by weight, based on the sum of all components of the photopolymerizable layer. Examples of suitable photoinitiators (b) are acyloins and acyloin ethers, as well as aromatic diketones and their derivatives. Examples of very useful compounds are benzoin and α-hydroxymethylbenzoin, as well as their alkyl ethers of 1 to 8 carbon atoms, eg. benzoin isopropyl ether, α-hydroxymethylbenzoin methyl ether or benzoin methyl ether, benzil monoketals, eg. benzil dimethyl ketal, benzil methyl ethyl ketal, benzil methyl benzyl ketal or benzil neopentyl ketal, and diarylphosphine oxides, as described in German Laid-Open Application DOS No. 2,909,992, eg. 2,6-dimethoxybenzoyldiphenylphosphine oxide or 2,4,6-trimethylbenzoyldiphenylphosphine oxide. Preferred photoinitiators (b) require only short minimum exposure times for initiating photopolymerization on exposure of the photopolymerizable layer to light having a wavelength of from 300 to 420 nm, preferably from 320 to 380 nm. Preferably, the photoinitiators (b) are not dyes.

The photopolymerizable layers used in the novel process contain, as an essential component, in addition to the components (a) and (b), a mixture of a certain dye (c1) with a mild reducing agent (c2) for the particular dye (c1) used. Surprisingly, we have found that the mixture of (c1) and (c2) does not initiate any appreciable photopolymerization in the photopolymerizable layer on exposure to actinic light; in contrast, when the layer is exposed to light having a wavelength longer than 450 nm, in particular visible light, a compound is produced which substantially inhibits or completely prevents photopolymerization initiated by the photoinitiator (b) in the layer so that the areas of the layer exposed in this manner can readily be washed out with a developer to give an excellent relief image. Suitable combinations of a dye (c1) and a mild reducing agent (c2) can readily be determined by a few simple preliminary experiments.

Particularly advantageous dyes (c1) of the stated formula (I) are those from the series comprising the thiazinium dyes of the formula (II)

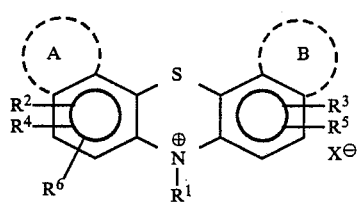

(II)

where $X^\ominus$, A, B, $R^1$, $R^2$, $R^3$, $R^4$, $R^5$ and $R^6$ have the above meanings. Examples of very useful dyes of this class are methylene blue (C.I. 52015) and thionine (C.I. 52025).

Other advantageous dyes are those from the series comprising the phenoxazinium dyes of the formula (III)

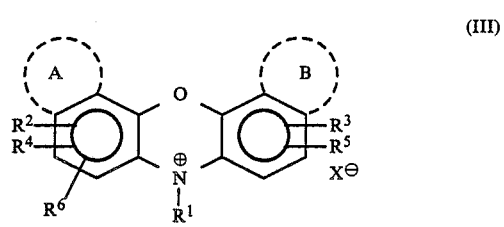

(III)

where $X^\ominus$, A, B, $R^1$, $R^2$, $R^3$, $R^4$, $R^5$ and $R^6$ have the above meanings. Examples of very useful dyes of this class are Capri blue GN (C.I. 51000), zapon fast blue 3 G (C.I. 51005), gallo blue E (C.I. 51040), fast new blue 3 G (C.I. 51175), Nile blue A (C.I. 51180), fast green M (C.I. 51210), fast black L (C.I. 51215) and rhodanil blue, and the salt and amide of rhodamine B (Basic Violet 10, C.I. 45170) and Nile blue (Basic Blue 12, C.I. 51180).

Other particularly preferred compounds are those of the series comprising the phenazinium dyes of the formula (IV)

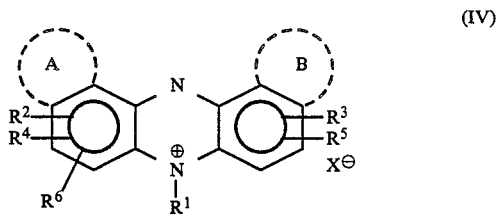

(IV)

where $X^\ominus$, A, B, $R^1$, $R^2$, $R^3$, $R^4$, $R^5$ and $R^6$ have the above meanings. Examples of very useful dyes of this class are neutral red (C.I. 50040), neutral violet (C.I. 50030), azine scarlet G (C.I. 50045), rhoduline heliotrope 3 B (C.I. 50055), neutral blue C (C.I. 50150), azine green GB (C.I. 50155), safranine B (C.I. 50200), indamine blue B (C.I. 50204), rhoduline red G (C.I. 50215), rhoduline blue GG extra (C.I. 50220), indazine GB (C.I. 50221), safranine T (C.I. 50240), mauveine (C.I. 50245), naphthyl red (C.I. 50370) and nigrosine black T (C.I. 50415).

Other suitable dyes are the acridinium dyes of the formula (V)

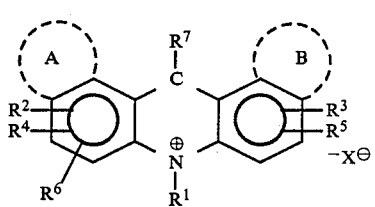

(V)

where $X^\ominus$, A, B, $R^1$, $R^2$, $R^3$, $R^4$, $R^5$, $R^6$ and $R^7$ have the above meanings. Useful dyes from among these are acriflavine (C.I. 46000), acridine orange (C.I. 46005), acridine scarlet J (C.I. 46015), acridine yellow G (C.I. 46025), aurazine G (C.I. 46030), C.I. Basic Orange 4–11 (C.I. 46035), phophine E (C.I. 46045), flaveosine (C.I. 46060) benzoflavine (C.I. 46065) and rheonine A (C.I. 46075).

To enable the formulae (I) to (V) to be better understood, examples of the radicals $R^1$, $R^2$, $R^3$, $R^4$, $R^5$, $R^6$ and $R^7$, and A, B and $X^\ominus$ of suitable dyes are given below:

$R^1$ is, for example, hydrogen, methyl, ethyl, phenyl, 2-methoxyphenyl, 4-methylphenyl, 2,4-dimethylphenyl, 2-methylphenyl, 4-sulfophenyl, 2-methyl-3-sulfophenyl, naphth-1-yl, naphth-2-yl or 5,8-disulfonaphth-2-yl. $R^2$ and $R^3$ are identical or different and are each, for example, hydrogen, hydroxyl, methoxy, di-(p-diethylaminophenyl)-methyl, amino, N-methylamino, N-ethylamino, dimethylamino, diethylamino, N-phenylamino, N-(4-sulfophenyl)-amino, N-(2,4-disulfophenyl)-amino, N-(2-sulfo-4-aminophenyl)-amino, N-(2-methylphenyl)-amino, N-(3-methoxyphenyl)-amino, N-(4-diethylaminophenyl)-amino, N-(4-dimethylaminophenyl)-amino, N-(2-sulfo-4-methylamino-5-methylphenyl)-amino, N-(5,8-disulfonaphthyl)-amino, N-ethyl-N-benzylamino, phenaziniumylamino, oxaziniumylamino or rhodaminylamino. $R^4$ and $R^5$ are identical or different and are each, for example, hydrogen, methyl, methoxy, sulfo, N-methylamino, N-ethylamino, dimethylamino, diethylamino, N-phenylamino or N-(4-diethylamiophenyl)-amino. $R^6$ is, for example, hydrogen, hydroxyl, methoxy, chloro, bromo, carboxyl, carbomethoxy or N-acetylamino. $R^7$ is, for example, hydrogen, methyl, ethyl, phenyl, 4-aminophenyl or 2-carboxyphenyl.

Examples of acid anions are $Cl^\ominus$, $Br^\ominus$, $ClO_4^\ominus$, $HSO_4^\ominus$, $CH_3SO_4^\ominus$ and similar conventional acid anions, in particular monovalent inorganic and organic ones. The chlorohydrates are frequently very useful salts. A and B are each, for example, hydrogen, benzo [a], dibenzo [a, c], dibenzo [a, f], dibenzo [a, d], tetrabenzo [a, c, d, f], unsubstituted or substituted,

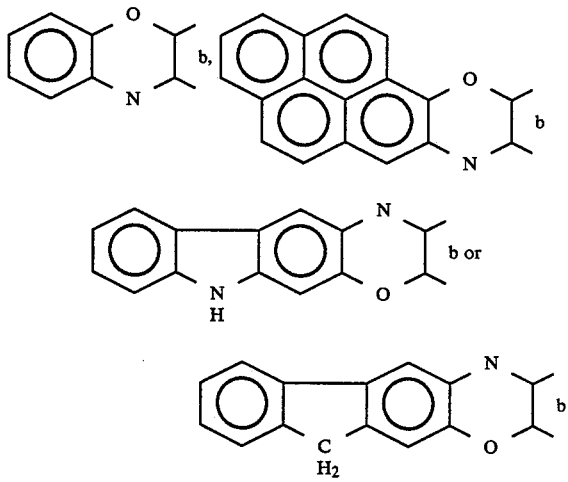

Owing to their good action and to the fact that they impart a pleasing coloration to the photopolymerizable layer, and also make visual assessment of the relief plate or printing plate easy, preferred dyes (c1) for the photopolymerizable layer are neutral red (C.I. 50040), safranine T (C.I. 50240) and in particular methylene blue (C.I. 52015) and thionine (C.I. 52025).

The photopolymerizable layer used according to the invention contains, in combination with the dye (c1), a sufficient amount of a mild reducing agent which does not reduce the said dye (c1) in the absence of actinic light, but is capable of reducing the dye (c1) when the latter is converted to the excited electronic state by exposure to light having a wavelength longer than 450 nm, in particular visible light, the product of the reduction being, in particular, a semiquinone. Examples of such mild reducing agents are ascorbic acid, anethole, thiourea, diethylallylthiourea and hydroxylamine derivatives, in particular N-allylthiourea and preferably salts of N-nitrosocyclohexylhydroxylamine, in particular the potassium and/or aluminum salts. The latter are also known to be inhibitors of thermal polymerization in photopolymerizable mixtures. The amount of the mild reducing agent (c2) present in the photopolymerizable layer is in general about 0.005–5, in particular 0.01–1, % by weight, based on the sum of all components of the photopolymerizable layer. In many cases, it has proven useful to add from 3 to 10 times the amount (weight ratio) of the dye (c1) used.

In addition to the said components, the photopolymerizable layer used according to the invention can of course also contain other additives conventionally used in photopolymerizable layers. These include, in particular, thermal polymerization inhibitors, eg. hydroquinone, p-methoxyphenol, dinitrobenzene, p-quinone, methylene blue, $\beta$-naphthol, N-nitrosamines, eg. N-nitrosodiphenylamine, phosphites, eg. triphenyl phosphite, or the salts, in particular the alkali metal and aluminum salts, of N-nitrosocyclohexylhydroxylamine. The thermal polymerization inhibitors are present in the photopolymerizable layer in general in an amount of from 0.001 to 3, in particular from 0.003 to 1, % by weight, based on the sum of all the components of the photopolymerizable layer. As already stated above, it is possible for the dyes present as component (c1), and/or the reducing agents present as component (c2), to act as thermal polymerization inhibitors in the layer, as is the case with, for example, methylene blue or the salts of N-nitrosocyclohexylhydroxylamine. We have found that such compounds conventionally used as thermal polymerization inhibitors can in fact be readily employed in the present invention to produce, when the photopolymerizable layer is exposed to light having a wavelength longer than 450 nm, a compound which prevents the photopolymerization initiated by the photoinitiator (b); on the other hand, in those areas of the layer which have not been exposed to light having a wavelength longer than 450 nm, these compounds inhibit the thermally induced polymerization but do not have an adverse effect on the photopolymerization initiated by the photoinitiator (b). Nevertheless, care should be taken to ensure that, in those cases where the dye (c1) and/or the mild reducing agent (c2) also act as thermal polymerization inhibitors, the amounts thereof in the layer are such that the conventionally used amounts of thermal polymerization inhibitors are not exceeded.

Examples of other additives which may be present in the photopolymerizable layers used in the novel process are conventional plasticizers usually used for this purpose, saturated low molecular weight compounds containing amide or alcohol groups, waxes, pigments, etc. Very advantageous layers for the production of photopolymer gravure printing plates contain, for example, finely divided, hard fillers such as quartz powder.

The photopolymerizable layers can be produced by a conventional method, for example by casting the layer from a solution of the components and evaporating the solvent. The photopolymerizable layers used in the novel process are essentially solvent-free and, depending on the type of components used, can be fluid. However, solid photopolymerizable layers are preferably used. The thickness of the photopolymerizable layer can be varied within wide limits, and is determined primarily by the intended use of the resulting relief plate or printing plate. For the production of photopolymer letterpress printing plates, the photopolymerizable layer is in general from 200 to 1,000 μm thick. For the production of gravure printing plates, it is advantageous to use layers which are about 50–500 μm thick. For the production of resist images, offset printing plates or masking films, thinner layers may also be used. In general, the photosensitive, photopolymerizable layer for the production of relief plates or printing plates is applied to a dimensionally stable base. Particularly suitable bases are the conventional metal substrates, eg. steel or aluminum sheets for the production of printing plates, or copper sheets or copperplated boards for the production of resist images, as well as dimensionally stable, preferably transparent, plastic films or sheets, for example those made of polyesters, such as polyethylene terephthalate or polybutylene terephthalate. To achieve good adhesion between the base and the photopolymerizable layer, the base can be pretreated mechanically or chemically and/or coated with an adhesive.

For example, very useful, solid, photopolymerizable layers for the production of relief plates and in particular letterpress printing plates contain from 35 to 90% by weight of one or more polymeric binders, in particular one or more nylon copolymers, one or more vinyl alcohol polymers or one or more elastomeric homopolymers or copolymers, from 6 to 60, in particular from 8 to 45, % by weight of one or more low molecular weight compounds (a) possessing more than one photopolymerizable, olefinically unsaturated double bond, or of a mixture of these with a low molecular weight compound possessing only one photopolymerizable, olefinically unsaturated double bond, from 0.2 to 6% by weight of a photoinitiator (b), from 0.001 to 2% by weight of a thermal polymerization inhibitor, from 0.0001 to 1, preferably from 0.0001 to 0.1, % by weight of a dye (c1) of the formula (I), and from 0.005 to 5% by weight of a mild reducing agent (c2), the said percentages always being based on the sum of all the components of the layer.

Regarding suitable photopolymerizable layers which can be used for the production of gravure printing plates and to which, when they are used in the novel process, soluble dyes (c1) and reducing agents (c2) are added, reference may be made to German Laid-Open Application DOS No. 3,128,949. Advantageously, photopolymerizable layers of this type contain a vinyl alcohol polymer or, in particular, an alcohol-soluble nylon copolymer of the above type, preferably in an amount of from 20 to 93, in particular from 45 to 87, % by weight, as the polymeric binder; in particular a diether obtained from 2 moles of N-methylolacrylamide and 1 mole of ethylene glycol, alone or in admixture with other photopolymerizable monomers, preferably in an amount of from 2 to 50, in particular from 5 to 30, % by weight, as the compound (a) possessing photopolymerizable, olefinically unsaturated double bonds; the finely divided, hard fillers described in German Laid-Open Application DOS No. 3,128,949, preferably fine quartz powder, in an amount of from 2 to 50, in particular from 5 to 25, % by weight; preferably from 0.2 to 5% by weight of a photoinitiator (b); dyes (c1) and reducing agents (c2) of the above type and in the above amount; and, if desired, other conventional fillers and additives, eg. thermal polymerization inhibitors.

Processing of the photopolymerizable layers into relief plates or printing plates is carried out, in accordance with the invention, as follows: the photopolymerizable layer, which is preferably applied to a base, is exposed imagewise to light having a wavelength longer than 450 nm, in particular visible light, and, simultaneously or subsequently is exposed uniformly to light having a wavelength of from 300 to 420 nm, preferably from 320 to 380 nm.

When we say that the photopolymerizable layer is exposed to light having the said wavelength, we mean that a high proportion, preferably not less than 80%, of the radiation emitted, should be within this wavelength range. The difference between the wavelengths of the sources of radiation used for the exposure can be small; however, the light of longer wavelength used for the imagewise exposure should not activate the photoinitiator (b) used and should initiate only slight photopolymerization in the layer, if at all, while the light of shorter wavelength for the uniform exposure should interact only slightly, if at all, with the dye (c1) employed, ie. the absorption of the said dye in the range of the light of shorter wavelength should be no more than 20%, preferably no more than 5%, of its maximum absorption. The light sources used are therefore preferably so chosen and matched to the photopolymerizable layer that their emission maxima are in the region of the absorption of the photoinitiator (b) used, or in the region of the absorption maximum of the dye (c1) used.

Examples of suitable light sources for the imagewise exposure to light having a wavelength longer than 450 nm are incandescent lamps and halogen lamps, as well as iron-doped or gallium-doped mercury vapor lamps, the large proportion of UV light emitted by the latter being removed by means of, for example, a yellow filter. For example, superactinic fluorescent tubes are very useful for the uniform exposure to light in the UV wavelength range. However, it is also possible to use light sources which emit both visible and UV light; to obtain light of the desired wavelength, suitable filters for instance are employed. A particular advantage of the novel process is that the photopolymerizable layer can be exposed using a conventional laser, provided that it emits light in the appropriate wavelength range. Examples of such lasers are argon lasers and ruby lasers.

The exposure time depends, in particular, on the composition of the photopolymerizable layer and on the light source or sources used, and can be, for example, from 0.01 to 10 minutes. In general, the time for imagewise exposure using the light of longer wavelength ranges from a few seconds, eg. 10 seconds, to no more than a few minutes, eg. 2 minutes. In practice, times substantially shorter than 1 minute have proven to be highly suitable for this exposure. Surprisingly, we have found that, for the uniform exposure using the UV light of shorter wavelength, a few seconds, in general less than 10, in particular even less than 5, seconds, are sufficient for achieving adequate photopolymerization in the layer and thus obtaining the difference in solubility between the areas of the layer which have been exposed imagewise and those which have not been so exposed, this difference in solubility being necessary for the production of relief plates and printing plates. Such short exposure times cannot be achieved with conventional photopolymerizable layers.

The exposure of the photopolymerizable layer to light of the stated, different wavelength ranges can be carried out in various ways. For example, the imagewise exposure with the light of longer wavelength and the uniform exposure with the UV light of shorter wavelength can be carried out in succession in two separate steps, or the exposures can be carried out simultaneously in one step.

The imagewise exposure of the photopolymerizable layer can be carried out, for example, by the conventional contact exposure method, i.e. by placing an image-bearing transparency, for example a photographic positive, on the photosensitive layer, and exposing the layer to the light of longer wavelength through the positive. Thereafter, the image-bearing transparency can be removed from the imagewise-exposed layer, and the latter can be exposed uniformly to UV light. If a photopolymerizable layer without a support, or a layer on a support which is transparent to actinic light is used, uniform exposure of the layer, from the back, to UV light can be carried out simultaneously with the imagewise exposure through the positive placed on the front face of the layer.

However, the imagewise exposure can also be carried out using projection means, for example a process camera, or a projector to throw an image-bearing transparency onto the photopolymerizable layer. In the latter case, uniform exposure to UV light can also be carried out simultaneously with the imagewise exposure, for example by arranging the light sources emitting UV light on either side of the beam of light of longer wavelength. In the case of projection exposure too, where a photopolymerizable layer without a base or a photopolymerizable layer applied to a transparent base is used, uniform exposure with UV light can be effected from the back of the layer, or through the transparent base, if present. In the case of projection exposure, and in other cases too, it may be advantageous to apply a thin, transparent top layer or cover sheet to the surface of the photopolymerizable layer, for example in order to prevent unnecessary diffusion of oxygen into the photopolymerizable layer. Such a top layer or cover sheet can be composed of materials conventionally used for this purpose, in particular polymers, eg. polyvinyl alcohol, polyethylene, polypropylene, polyvinyl chloride, polystyrene, polyesters, etc.

In another embodiment of the novel process, it is possible to carry out the exposure of the photopolymerizable layer using an image-bearing transparency whose image areas absorb only light in the visible wavelength range, i.e. light having a wavelength longer than 450 nm, but which is completely or substantially transparent to UV light having a wavelength of from 300 to 420 nm, in particular from 320 to 380 nm. Where such a photographic positive is used, the exposure is advantageously carried out using a single light source which emits both visible light and UV light in the appropriate wavelength ranges. The opaque areas of the image-bearing transparency prevent the passage of light in the visible wavelength range, so that the photopolymerizable layer is exposed imagewise to light having this wavelength through the transparent areas, while the UV light of shorter wavelength passes uniformly through the image-bearing transparency and falls on the photopolymerizable layer. In this case too, the exposure can be carried out as a contact exposure or in the form of a projection exposure.

As stated above, it is a substantial advantage of the process according to the invention that the exposure of the photopolymerizable layer can also be carried out by means of a laser. The imagewise exposure is carried out using a laser which emits light having a wavelength longer than 450 nm, in particular visible light. Imagewise exposure of the photopolymerizable layer using the laser is advantageously so carried out that the image-bearing transparency is scanned by means of a read laser, and the electrical information obtained, if necessary after intermediate storage, is transferred to the write laser, which then irradiates the photopolymerizable layer point by point or line by line, in accordance with the light/dark information contained in the image-bearing transparency. The laser beam can be moved to and fro over the photopolymerizable layer by means of a polygonal mirror system, or can irradiate this layer on a rotating drum. Exposure to UV light having a wavelength of from 300 to 420 nm, in particular from 320 to 380 nm, can in this case be carried out line by line, by parallel to the imagewise-modulated laser beam, for example by means of a UV laser. However, it is also possible first to irradiate the photopolymerizable layer with the imagewise-modulated laser beam having a wavelength in the visible range, and then, using either a UV laser or a conventional UV light source, to uniformly expose the photopolymerizable layer which has been exposed imagewise in this manner. One of the reasons why the exposure of the photopolymerizable layer to lasers is particularly advantageous is that in this case information stored in a computer or on magnetic recording material can be used directly for the production of relief plates and printing plates, without it being necessary to proceed via a reprographic film.

As stated above, exposure to light having a wavelength longer than 450 nm, in particular visible light, converts the dye (c1) to the excited electronic state, so that it can be reduced by the mild reducing agent (c2). This reduction of the dye (c1) in the excited state produces a compound which prevents photopolymerization in the layer when the latter is exposed to UV light which activates the photoinitiator (b). Since, in accordance with the invention, exposure to light having a wavelength longer than 450 nm is carried out imagewise, a latent image containing a photopolymerization inhibitor is thus formed in the layer. If the layer is then exposed to UV light which has a wavelength within the stated range and activates the photoinitiator (b), the photopolymerization thus initiated takes place only in those areas of the layer which have not been exposed to light having a wavelength longer than 450 nm. Formation of the photopolymerization inhibitor during exposure to light having a wavelength greater than 450 nm, ie. to visible light, takes place so rapidly and is so effective that exposure to visible light and to the UV light which initiates photopolymerization can be carried out simultaneously. It is even possible first to preexpose the photopolymerizable layer uniformly to UV light for a short time and only then to begin the imagewise exposure to visible light. Surprisingly, such a pronounced differentiation in the polymerization between the imagewise exposed and the non-imagewise exposed areas is obtained in every case that, in spite of extremely short exposure times, excellent relief plates and printing plates which faithfully reproduce the original and have excellent properties and in particular a very good relief image can be obtained.

After exposure of the layer, its unpolymerized areas which have been exposed imagewise are removed mechanically and/or are advantageously washed out with a developer, and non-imagewise exposed, photopolymerized areas of the layer being left to form the relief plate or printing plate. Suitable developers are the solvents conventionally used for photopolymerizable layers of the type under discussion, for example aliphatic hydrocarbons, chlorohydrocarbons, aromatic hydrocarbons, esters, ketones, ethers and in particular alcohols, alcohol/water mixtures and aqueous systems, in particular water as such. After development, the resulting relief plate or printing plate is dried and, in some cases, advantageously postexposed uniformly to UV light having a wavelength of from 300 to 420 nm. For the production of gravure printing plates, it is advantageous to carry out drying for a relatively long time at about 70°–100° C.

The relief plates produced according to the invention can advantageously be used as printing plates, in particular for letterpress printing, flexographic printing or gravure printing, and give excellent printed copies even in long runs. Moreover, the novel process is also suitable, for example, for the production of offset printing plates, masking films or resist images, for example for the production of printed circuits, circuit boards, etc.

The Examples which follow illustrate the invention. In the Examples and Comparative Experiments, parts and percentages are by weight, unless stated otherwise. Parts by weight bear the same relation to parts by volume as the kilogram to the liter.

EXAMPLE 1

A 65% strength methanolic solution of 99.4 parts of a photopolymerizable mixture consisting of 60% of a nylon copolymer obtained from adipic acid, hexamethylenediamine, 4,4′-diaminodicyclohexylmethane and ε-caprolactam, 25% of a diether obtained from 1 mole of ethylene glycol and 2 moles of N-hydroxymethylacrylamide, 13.5% of benzenesulfonamide and 1.5% of benzoin tetrahydropyranyl ether, 0.6 part of the potassium salt of N-nitrosocyclohexylhydroxylamine and 0.04 part of safranine T (C.I. 50240) was applied in a layer to a steel sheet coated with a layer of adhesive (reflectance: about 15%), so that, after drying at 70° C., a 300 μm thick photopolymerizable layer resulted. This layer was exposed imagewise for 30 seconds through a photographic positive using a commercial 1000 W photographic floodlight arranged at a distance of 1 m. Directly thereafter, the layer was exposed uniformly for 2 seconds, in a flat-plate exposure unit equipped with superactinic fluorescent tubes ($\lambda_{max}$ 350–400 nm) and a high-speed starter, the layer being crosslinked in those areas which were covered by the dark regions of the positive during the imagewise exposure. The non-crosslinked areas of the layer which had been exposed imagewise were then washed out with an alcohol/water mixture.

The resulting positive relief plate was very suitable for use as a letterpress printing plate. On a letterpress printing press, this plate gave 100,000 excellent prints, without a loss in quality being observed.

COMPARATIVE EXPERIMENT A

The procedure described in Example 1 was followed, except that the addition of safranine T to the photopolymerizable layer was omitted. After uniform exposure with the superactinic fluorescent tubes for 2 seconds, the entire layer was uniformly crosslinked. It was not possible to produce a relief plate.

EXAMPLE 2

The procedure described in Example 1 was followed, except that in this case, instead of safranine T, the dye neutral red (C.I. 50040) was used in the same concentration. Otherwise, the process conditions corresponded to those of Example 1. In this case too, a high-quality letter-press printing plate was obtained, which gave more than 100,000 prints of uniform quality.

EXAMPLE 3

The procedure described in Example 1 was followed, but in this case, instead of safranine T, thionine (C.I. 52025) was used as the dye. The uniform exposure in the flat-plate exposure unit was carried out for 10 seconds in this case. Once again, the resulting positive letterpress printing plate was highly suitable for long press runs.

EXAMPLE 4

As described in Example 1, a photopolymerizable layer was produced on a steel sheet as the base, using the same components. However, imagewise exposure of the layer to visible light was carried out in this case simultaneously with the uniform exposure to UV light. For this purpose, an image-bearing positive was first produced using a red diazotype film. The resulting positive was virtually opaque (optical density greater than 2) to visible light having a wavelength of from 460 to 540 nm, in the opaque areas, whereas it was completely transparent (optical density about 0.13), ie. even in the image-bearing areas, to light in the UV range (eg. at 365 nm). This positive was placed on the photopolymerizable layer. Exposure was carried out in a commercial exposure unit containing an iron-doped medium-pressure mercury vapor lamp having an output of 2 kW. After an exposure time of 30 seconds, the layer was washed out with an alcohol/water mixture. The resulting positive relief plate had an excellent relief image.

COMPARATIVE EXPERIMENT B

The procedure described in Example 1 was followed, except that in this case, instead of safranine T, the triphenylmethane dye crystal violet (C.I. 42555) was used. Exposure of the photopolymerizable layer was carried out as described in Example 4. After an exposure time of only 2 seconds, the entire layer was uniformly polymerized, whereas after an exposure time of only 1 second it was still completely soluble. It was not possible to produce a relief plate in this case.

EXAMPLE 5

A photopolymerizable layer produced as described in Example 3 was in this case exposed imagewise using a projector. The positive was in the gate of the projector, and was projected onto the photopolymerizable layer for 60 seconds, enlarged on a scale of 1:2. Exposure to UV light was carried out simultaneously by means of two commercial superactinic fluorescent tubes (5 watt), which illuminated the plate uniformly from a distance of 25 cm and at an angle of about 60° to the plane of the plate. After this exposure, the plate was washed out with ethanol/water to give an excellent relief plate which was very suitable for letterpress printing.

EXAMPLE 6

A 60% strength aqueous solution of a mixture of about 60% of a polyvinyl alcohol, having a degree of hydrolysis of about 80% and a mean molecular weight of about 25,000, 20% of a diether obtained from 1 mole of ethylene glycol and 2 moles of N-hydroxymethylacrylamide, 18% of hydroxyethyl methacrylate, 1.4% of benzoin isopropyl ether, 0.04% of safranine T (C.I. 50240) and 0.6% of the potassium salt of N-nitrosocyclohexylhydroxylamine was applied in a layer to a steel sheet coated with a layer of adhesive (reflectance: about 15%), so that, after drying at about 70° C., a 300 μm thick photopolymerizable layer resulted.

Exposure of the photopolymerizable layer was carried out as described in Example 4, and the layer was then washed out for 2 minutes with water at 40° C. in a spray washer. The resulting positive relief plate was very suitable as a letterpress printing plate. On a printing press, this plate gave more than 100,000 printed copies, without any visible signs of wear.

COMPARATIVE EXPERIMENT C

The procedure described in Example 6 was followed, except that in this case safranine T was not added to the photopolymerizable layer. Using the procedure described in Example 6, it was not possible to produce a relief plate.

COMPARATIVE EXPERIMENT D

The procedure described in Example 6 was followed, except that in this case the potassium salt of N-nitrosocyclohexylhydroxylamine was not added to the photopolymerizable layer. Using the procedure described in Example 6, it was not possible to produce a relief plate.

EXAMPLE 7

A 200 μm thick photopolymerizable layer having the following composition was applied to a 240 μm thick steel sheet provided with a polyurethane adhesive layer: 61 parts of a nylon copolymer which was soluble in aqueous alcohol and consisted of about equal parts of hexamethylenediamine adipate, 4,4'-diaminodicyclohexylmethane adipate and caprolactam, 27 parts of a diether obtained from 1 mole of ethylene glycol and 2 moles of N-methylolacrylamide, 10 parts of the fine quartz powder (F 600 type from Quarz-Werke Frechen), 2 parts of benzil dimethyl ketal, 0.3 part of the potassium salt of N-nitrosocyclohexylhydroxylamine and 0.02 part of the dye safranine T (C.I. 50240). The components of the layer were mixed together to give an intimate mixture.

The photopolymerizable layer was exposed for 30 seconds to the visible range of light from an iron-doped mercury vapor lamp, through a photographic negative for gravure printing. The range of the emitted light having a wavelength shorter than 450 nm was removed by means of a yellow filter. Directly thereafter, the image-bearing transparency was removed from the layer, and the latter was exposed uniformly for 1 second with superactinic fluorescent tubes. Thereafter, the soluble, unpolymerized areas of the layer were washed out with an alcohol/water mixture, and the resulting gravure printing plate was dried for 30 minutes at 80° C. The wells were about 30 μm deep and had steep sidewalls. This gravure printing plate gave high-quality prints.

COMPARATIVE EXPERIMENT E

When the procedure described in Example 7 was followed, except that the addition of safranine T was omitted, the layer was still completely soluble after uniform exposure to UV light for 0.5 second, whereas it was completely polymerized after exposure for 1 second. It was not possible to produce a gravure printing plate.

EXAMPLE 8

Using a procedure similar to that described in Example 7, a photopolymerizable layer having the following composition was produced on a steel sheet: 61 parts of a partially hydrolyzed polyvinyl alcohol, having a degree of hydrolysis of from 80 to 82% and a molecular weight of about 25,000, 27 parts of a diether obtained from 1 mole of ethylene glycol and 2 moles of N-methylolacrylamide, 10 parts of fine quartz powder (as in Example 7), 2 parts of benzil dimethyl ketal, 0.3 part of the potassium salt of N-nitrosocyclohexylhydroxylamine and 0.02 part of the dye safranine T (C.I. 50240). The photopolymerizable layer was exposed and after-treated, these steps being carried out as described in Example 7. In the resulting gravure printing plate, the wells were 25 μm deep and had steep sidewalls. This plate too, gave excellent printed copies.

EXAMPLE 9

The procedure described in Example 1 was followed, except that in this case, instead of the potassium salt of N-nitrosocyclohexylhydroxylamine, 0.3 part of N-allylthiourea was used as the reducing agent and 0.1 part of hydroquinone monomethyl ether was used as a thermal polymerization inhibitor. Uniform exposure to UV light was carried out for 4 seconds in this case. Here again, an excellent positive relief which was very useful as a letter-press printing plate was obtained.

We claim:

1. A positive-working process for producing relief and printing plates which comprises:
   (I) forming a photosensitive element consisting of a supported photopolymerizable layer which contains:
   (a) one or more compounds possessing one or more photopolymerizable olefinically unsaturated double bonds,
   (b) one or more photo-initiators which, when exposed to light having a wavelength of from 300 to 420 nm, initiate rapid photopolymerization in the layer,
   (c) an additive combination comprising:
   (c$_1$) from 0.001 to 0.2% by weight, based on the sum of all components in the layer, of a soluble dye of the formula

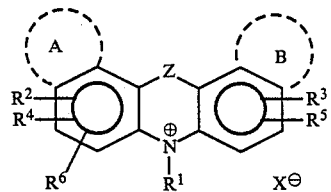

where
Z is N, O, S or CR$^7$,
R$^1$ is hydrogen, C$_1$–C$_4$-alkyl, unsubstituted or substituted phenyl or naphthyl, R$^2$ and R$^3$ are identical or different radicals and are each hydrogen, hydroxyl, C$_1$–C$_4$-alkoxy, phenoxy, unsubstituted or substituted diarylmethyl or NRR, where R is H or a substituted or unsubstituted alkyl, aryl or aralkyl radical, and the two radicals R can be identical or different, R⁴ and R⁵ are identical or different radicals and are each hydrogen, $C_1$–$C_4$-alkyl, phenyl, hydroxyl, $C_1$–$C_4$-alkoxy, sulfo or NRR where R is H or an unsubstituted or substituted acyl, alkyl, aryl or aralkyl radical, and the two radicals R can be identical or different, $R^6$ is hydrogen, hydroxyl, $C_1$–$C_4$-alkoxy, carboxyl, carbalkoxy, N-acylamino or halogen, $R^7$ is hydrogen, $C_1$–$C_4$-alkyl or an unsubstituted or substituted aryl or aralkyl group, $X^\ominus$ is an acid anion, and A and B can be identical or different and are each hydrogen or a benzocyclic, naphthocyclic or heterocyclic system fused in the a-, b- or c-position, with the proviso that if A is a fused ring system of the stated type, one of the radicals $R^2$ and $R^4$ is absent, and (c2) from 0.0005 to 5% by weight, based on the sum of all components of the photopolymerizable layer, of a mild reducing agent which does not reduce said dye in the absence of actinic light, but is capable of reducing this dye after it has been converted to the excited electronic state by exposure to light having a wavelength in the visible range, with or without other additives, II. subjecting said layer to an imagewise irradiation with visible light for effecting an imagewise reduction of said dye component which results in the production of a compound capable of preventing photopolymerization when said photo-initiator component of the layer is activated, III. exposing said layer uniformly to light having a wavelength in the range of from 300 to 420 nm to activate said photo-initiator and effect polymerization in those areas of the layer not exposed to the previous irradiation with visible light, and IV. forming a positive relief by removing the unpolymerized areas from said layer.

2. A process as claimed in claim 1, wherein the layer contains, as the dye (c1), a soluble phenoxazinium dye of the formula (I) where Z is O.

3. A process as claimed in claim 1, wherein the layer contains, as the dye (c1), a soluble phenazinium dye of the formula (I) where Z is N.

4. A process as claimed in claim 1, wherein the layer contains, as the dye (c1), a soluble thiazinium dye of the formula (I) where Z is S.

5. A process as claimed in claim 1, wherein the layer contains, as the dye (c1), a soluble acridinium dye of the formula (I) where Z is $CR^7$.

6. A process as claimed in claim 1, wherein the layer contains a salt of N-nitrosocyclohexylhydroxylamine as the mild reducing agent (c2).

7. A process as claimed in claim 1, wherein the layer contains N-allylthiourea as the mild reducing agent (c2).

8. A process as claimed in claim 1, wherein the layer contains a polymeric binder which is compatible in a mixture with the other components.

9. A process as claimed in claim 1 wherein the layer furthermore contains thermal polymerization inhibitors, finely divided fillers, plasticizers, saturated low molecular weight compounds possessing amide or alcohol groups, waxes and/or pigments.

10. A process as claimed in claim 3, wherein the layer contains, as the dye (c1), neutral red (C.I. 50040) or safranine T (C.I. 50240).

11. A process as claimed in claim 4, wherein the layer contains, as the dye (c1), thionine (C.I. 52025) or methylene blue (C.I. 52015).

12. A process as claimed in claim 1, wherein the layer is exposed imagewise, for from 0.01 to 10 minutes, to light having a wavelength in the visible range.

13. A process as claimed in claim 1, wherein the time for uniform exposure of the layer to light having a wavelength of from 300 to 420 nm is from 0.1 to 30 seconds.

14. A process as claimed in claim 1, wherein the photosensitive photopolymerizable layer is applied to a dimensionally stable base.

15. A process as claimed in claim 1, wherein the imagewise exposure to the light in the visible wavelength range is carried out using a projector.

16. A process as claimed in claim 15, wherein sources emitting light having a wavelength of from 300 to 420 nm are arranged on either side of the beam of light from the projector, and irradiate the entire layer.

17. A process as claimed in claim 14, wherein the photopolymerizable layer is applied to a transparent base, imagewise exposure to the light in the visible wavelength range is effected from that side of the layer which faces away from the base, and uniform exposure to light having a wavelength of from 300 to 420 nm is carried out through the base.

18. A process as claimed in claim 1, wherein the imagewise exposure is carried out using a photographic transparency whose image-bearing areas absorb only light having a wavelength in the visible range, and exposure of the layer to this light of longer wavelength and to light having a wavelength of from 300 to 420 nm is carried out through the transparency.

19. A process as claimed in claim 1, wherein the layer is exposed imagewise using a laser which emits light having a wavelength in the visible range, and exposure to light having a wavelength of from 300 to 420 nm can be carried out either line by line, parallel to the imagewise modulated laser beam, by means of light which is not modulated imagewise, or the layer, after it has been written using the imagewise modulated laser, can be exposed uniformly.

20. A process as defined in claim 1 wherein the layer is solid and is formed from 35 to 90% by weight of a polymeric binder, from 6 to 60% by weight of one or more low molecular weight compounds containing more than one photopolymerizable olefinically unsaturated double bond, or of a mixture of these with a low molecular weight compound containing only one photopolymerizable olefinically unsaturated double bond, from 0.2 to 6% by weight of a photoinitiator (b), from 0.001 to 2% by weight of a thermopolymerization inhibitor, from 0.0001 to 1% by weight of a dye (c1) of the formula (I) and from 0.005 to 5% by weight of a reducing agent (c2).

21. A process as defined in claim 1 wherein the layer is liquid and is formed from 45 to 75% by weight of an unsaturated polyester having an acid number of from 100 to 150, from 15 to 25% by weight of a monomer containing one or more allyl groups and two olefinically unsaturated double bonds, from 5 to 25% by weight of a monomer containing one or more acrylate or methacrylate groups, from 1 to 10% by weight of a saturated or olefinically unsaturated low molecular weight compound containing one or more amide groups, from 0.2 to 4% by weight of a photoinitiator (b), from 0.003 to 1% by weight of a thermal polymerization inhibitor, from 0.0001 to 1% by weight of a dye (c1) of the formula (I) and from 0.005 to 5% by weight of a reducing agent (c2).

22. A positive-working process for producing relief and printing plates which comprises:
(I) forming a photosensitive element consisting of a supporting base and a photopolymerizable layer which contains:
(a) from 2 to 60% by weight, based on the sum of all components of the layer, of one or more compounds possessing one or more photopolymerizable olefinically unsaturated double bonds,
(b) from 0.1 to 10% by weight, based on the sum of all components of the layer, of one or more photoinitiators which, when exposed to light having a wavelength of from 300 to 420 nm in the layer,
(c) an additive combination comprising:
(c1) from 0.0001 to 0.2% by weight, based on the sum of all components in the layer, of a soluble dye of the formula

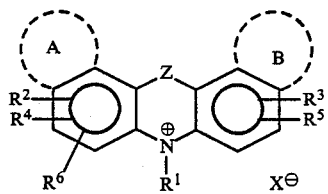

where
Z is N, O, S or $CR^7$,
$R^1$ is hydrogen, $C_1$–$C_4$-alkyl, unsubstituted or substituted phenyl or naphthyl,
$R^2$ and $R^3$ are identical or different radicals and are each hydrogen, hydroxyl, $C_1$–$C_4$-alkoxy, phenoxy, unsubstituted or substituted diarylmethyl or NRR, where R is H or a substituted or unsubstituted alkyl, aryl or aralkyl radical, and the two radicals R can be identical or different,
$R^4$ and $R^5$ are identical or different radicals and are each hydrogen, $C_1$–$C_4$-alkyl, phenyl, hydroxyl, $C_1$–$C_4$-alkoxy, sulfo, or NRR where R is H or an unsubstituted or substituted acyl, alkyl, aryl or aralkyl radical, and the two radicals R can be identical or different,
$R^6$ is hydrogen, hydroxyl, $C_1$–$C_4$-alkoxy, carboxyl, carbalkoxy, N-acylamino or halogen,
$R^7$ is hydrogen, $C_1$–$C_4$-alkyl or an unsubstituted or substituted aryl or aralkyl group,
$X^\ominus$ is an acid anion, and
A and B can be identical or different and are each hydrogen or a benzocyclic, naphthocyclic or heterocyclic system fused in the a-, b- or c-position, with the proviso that if A is a fused ring system of the stated type, one of the radicals $R^2$ and $R^4$ is absent, and
(c2) from 0.0005 to 5% by weight, based on the sum of all components of the photopolymerizable layer, of a mild reducing agent which does not reduce said dye in the absence of actinic light, but is capable of reducing this dye after it has been converted to the excited electronic state by exposure to light having a wavelength in the visible range, with or without other additives,
II. subjecting said layer to an imagewise irradiation with visible light for effecting an imagewise reduction of said dye component which results in the production of a compound capable of preventing photopolymerization when said photo-initiator component of the layer is activated,
III. exposing said layer uniformly to light which has a wavelength in the range of from 300 to 420 nm to activate said photo-initiator and effect polymerization in those areas of the layer not exposed to the previous irradiation with visible light, and
IV. forming a positive relief by removing the unpolymerized areas from said layer.

* * * * *